(12) United States Patent
Mulligan et al.

(10) Patent No.: US 7,883,343 B1
(45) Date of Patent: Feb. 8, 2011

(54) METHOD OF MANUFACTURING SOLAR CELL

(75) Inventors: William P. Mulligan, San Jose, CA (US); Michael J. Cudzinovic, Sunnyvale, CA (US); Thomas Pass, San Jose, CA (US); David Smith, San Jose, CA (US); Neil Kaminar, Boulder Creek, CA (US); Keith McIntosh, Newport Beach (AU); Richard M. Swanson, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 986 days.

(21) Appl. No.: 11/692,657

(22) Filed: Mar. 28, 2007

Related U.S. Application Data

(62) Division of application No. 10/412,638, filed on Apr. 10, 2003, now Pat. No. 7,339,110.

(51) Int. Cl.
*H01L 21/00* (2006.01)
(52) U.S. Cl. .......... 439/98; 257/E25.004; 257/E25.007; 136/256; 136/261
(58) Field of Classification Search .................... 438/98; 257/E25.004, E25.007; 136/256, 261
See application file for complete search history.

(56) References Cited

U.S. PATENT DOCUMENTS 4,234,352 A    11/1980    Swanson (Continued)

FOREIGN PATENT DOCUMENTS

GB    2 095 904 A    10/1982

(Continued)

OTHER PUBLICATIONS

You, J. et al. "A study on Cu Metallization for Crystalline Si Solar Cells," Conf. REc. 29th IIEEE PV Spec. Conf., 277-280, May 2002.

(Continued)

*Primary Examiner*—Davienne Monbleau
*Assistant Examiner*—Matthew Reames
(74) *Attorney, Agent, or Firm*—Okamoto & Benedicto LLP

(57) ABSTRACT

A solar cell that is readily manufactured using processing techniques which are less expensive than microelectronic circuit processing. In preferred embodiments, printing techniques are utilized in selectively forming masks for use in etching of silicon oxide and diffusing dopants and in forming metal contacts to diffused regions. In a preferred embodiment, p-doped regions and n-doped regions are alternately formed in a surface of the wafer through use of masking and etching techniques. Metal contacts are made to the p-regions and n-regions by first forming a seed layer stack that comprises a first layer such as aluminum that contacts silicon and functions as an infrared reflector, second layer such titanium tungsten that acts as diffusion barrier, and a third layer functions as a plating base. A thick conductive layer such as copper is then plated over the seed layer, and the seed layer between plated lines is removed. A front surface of the wafer is preferably textured by etching or mechanical abrasion with an IR reflection layer provided over the textured surface. A field layer can be provided in the textured surface with the combined effect being a very low surface recombination velocity.

18 Claims, 6 Drawing Sheets

U.S. PATENT DOCUMENTS

| | | | |
|---|---|---|---|
| 4,478,879 | A | 10/1984 | Baraona et al. |
| 4,557,037 | A | 12/1985 | Hanoka et al. |
| 4,920,639 | A | 5/1990 | Yee |
| 4,927,770 | A | 5/1990 | Swanson |
| 5,053,083 | A | 10/1991 | Sinton |
| 5,151,168 | A | 9/1992 | Gilton et al. |
| 5,310,699 | A | 5/1994 | Chikawa et al. |
| 5,320,684 | A | 6/1994 | Amick et al. |
| 5,538,564 | A | 7/1996 | Kaschmitter |
| 5,641,362 | A | 6/1997 | Meier |
| 6,224,737 | B1 | 5/2001 | Tsai et al. |
| 6,551,931 | B1 | 4/2003 | Edelstein |
| 6,624,737 | B2 | 9/2003 | Chang et al. |
| 6,638,688 | B2 | 10/2003 | Ching et al. |
| 2003/0160026 | A1 | 8/2003 | Klein et al. |
| 2004/0200520 | A1 | 10/2004 | Mulligan et al. |

FOREIGN PATENT DOCUMENTS

| | | |
|---|---|---|
| WO | WO 82/01102 | 4/1982 |

OTHER PUBLICATIONS

Sinton et al., "27.5-Percent Silicon Concentrator Solar Cells," IEEE Electronic Device Letters, vol. EDL-7, No. 10, Oct. 1986, pp. 567-569.

Verlinden et al., "High Efficiency Interdigitated Back Contact Silicon Solar Cells," Proc. 19th IEEE Photovolt. Solar Energy Conf., New Orleans, LA, May 1987, pp. 405-410.

Sinton et al., "Simplified Backside-Contact Solar Cells," IEEE Transactions on Electron Devices, vol. 37, No. 2, Feb. 1990, pp. 348-352.

Gee et al., "Emitter Wrap-Through Solar Cell," 23rd IEEE Photo. Spec. Conf., 1993, pp. 265-270.

Verlinden et al., "High Efficiency Silicon Point-Contact Solar Cells for Concentrator and High Value One-Sun Applications," 12th European Photovoltaic Solar Energy Conference, Amsterdam, The Netherlands, Apr. 11-15, 1994, pp. 1477-1480.

Gee et al., "Progress on the Emitter Wrap-Through Silicon Solar Cell," 12th European Photovoltaic Solar Energy Conference, Amsterdam, The Netherlands, Apr. 11-15, 1994, pp. 743-746.

Schönecker et al., "An Industrial Multi-Crystalline EWT Solar Cell with Screen Printed Metallisation," 14th European Photovoltaic Solar Energy Conference, Barcelona, Spain, Jun. 30-Jul. 5, 1997, pp. 796-799.

Meier et al., "Self-Doping Contacts and Associated Silicon Solar Cell Structures," 2nd World Conference and Exhibition on Photovoltiac Solar Energy Conversion, Vienna, Austria, Jul. 6-10, 1998, pp. 1491-1494.

Faika et al., "Simplification of EWT (Emitter Wrap-Through) Solar Cell Fabrication Using AL-P-Codiffusion," Proc. 28th IEEE Photovoltiac Specialists Conf., 2000, pp. 260-263.

Van Kerschaver et al., "Towards Back Contact Silicon Solar Cells with Screen Printed Metallisation," Proc. 28th IEEE Photovoltiac Specialists Conf., 2000, pp. 209-212.

Kress et al., "10×10 cm2 Screen Printed Back Contact Cell with a Selective Emitter," Proc. 28th IEEE Photovoltiac Specialists Cont., 2000, pp. 213-216.

METHOD OF MANUFACTURING SOLAR CELL

CROSS-REFERENCE TO RELATED APPLICATIONS

This application is a divisional of and claims priority under 35 U.S.C. §120 from U.S. application Ser. No. 10/412,638, filed Apr. 10, 2003 now U.S. Pat. No. 7,339,110, which is commonly assigned, and which is incorporated by reference herein in its entirety and for all purposes.

BACKGROUND OF THE INVENTION

This invention relates generally to solar cells, and more particularly the invention relates to a solar cell structure which is efficient in operation and economical to manufacture.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g. photons have a wavelength of 1.1 μm and less) create heat. These and other losses limit the efficiency of silicon photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance because there are no front contacts. In addition to the performance advantages, the back-contact cell structure allows simplified module assembly due to coplanar contacts. See Swanson U.S. Pat. No. 4,927,770 for example.

While interdigitated back-contact (IBC) solar cells have been fabricated, cost considerations have prevented the IBC solar cell from being commercialized. Heretofore, conventional microelectronics (integrated circuit) processing has been employed in fabricating IBC solar cells, including the use of backside diffusions, contacts, and metal lines fabricated by conventional microelectronics photolithography, thin film metallization, and etching processes. This fabrication process is capable of producing high efficiency solar cells, but the process is not cost effective for application in conventional low-cost, flat-plate solar panels. The key problem with practical realization of an IBC solar cell by this process is the high cost of fabrication, including the use of photoresist materials, processing and mask alignment, and the use of thick metal conductor deposition by vacuum evaporation or sputtering. Further, the processing must be carried out in a clean room environment. Thus IBC solar cells fabricated using these methods have been restricted to application in high concentration solar cells or in very high value one-sun applications.

BRIEF SUMMARY OF THE INVENTION

In accordance with the invention, a solar cell structure is provided which can be readily manufactured using alternative processing techniques which are less expensive than microelectronic circuit processing.

In one preferred embodiment, a silicon cell having a first major surface for receiving solar radiation has an opposing or backside surface in which p-doped and n-doped regions are formed in a spaced parallel arrangement. The p and n regions can be in offset planes or in the same plane. Interdigitated metal contacts respectively contact the p and n doped regions.

More particularly, the doped regions can be formed by first applying one dopant type to the entire back side of the cell by high temperature diffusion. Next, a patterned etch resist is applied to the cell by a low cost printing technology. This is followed by selective etching of a thermal oxide and doped region, and then by high temperature diffusion of the other dopant and thermal growth of a silicon oxide layer.

In forming the interdigitated metal contacts to the p and n regions, arrays of small contact openings are fabricated in the silicon oxide layer by using a patterned etch resist and chemical etching. A seed layer metal stack is then sputtered on the back side of the cell. The first metal in the stack provides ohmic contact to the silicon through the contact openings in the oxide and acts as an infrared reflector. A second metal layer acts as a diffusion barrier and adhesion layer. A top metal layer then forms a base to initiate plating. A plating resist is then applied over the seed layer, and metal is plated to the cell to build up thickness for the metal grid lines. Finally, the plating resist is stripped, and the metal seed layer between the grid lines is removed by chemical etching.

The first surface of the cell is preferably textured, as is conventional in solar cells. The texturing is preferably accomplished chemically. An antireflection nitride layer is then applied over the textured surface to assist in the coupling of light energy into the solar cell and hence improve efficiency.

The invention and objects and features thereof will be more readily apparent from the following detailed description and appended claims when taken with the drawings.

DETAILED DESCRIPTION OF THE INVENTION

Figure 1:
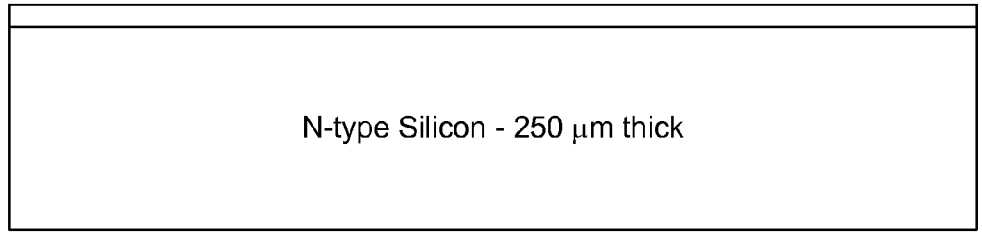
FIGS. 1-15 are side views in section illustrating steps in fabricating a solar cell in accordance with one embodiment of the invention.

A solar cell in accordance with the invention is preferably manufactured in a single crystalline silicon substrate having a (100) crystalline orientation or in a multi-crystalline silicon substrate with minority carrier lifetime greater than 200 microseconds. FIG. 1 is a side view in section of such a wafer 10 which is doped n-type in the resistivity range of 1-20 ohm/cm and with a thickness of approximately 200 μm. The first step of the process is caustic etching of the wafer using KOH or NaOH to remove solid damage from ingot wafering. Typically, 20-50 μm of silicon are removed. After the caustic etch, the wafers are cleaned using a standard pre-diffusion, wet cleaning sequence.

Figure 2:
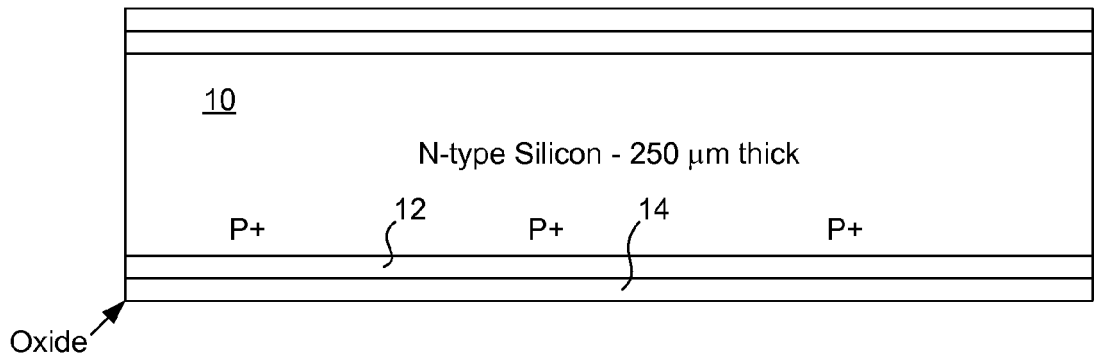

Next, as shown in FIG. 2, the wafer is blanket-diffused on both sides in diffusion boats in a high temperature diffusion furnace. In a preferred embodiment, a liquid boron dopant source ($BBr_3$) is used and a dopant drive forms a p+ layer 12. The dopant drive is followed by growth of a thermal silicon oxide layer 14. Typically, the junction depth of layer 12 is 1.8±0.5 μm and the resultant sheet resistance is 16±4 ohms per square. The thickness of thermal oxide layer 14 is 2,500±200 Å.

Alternatively, the polarity of the diffusions can be reversed, with n+ diffusion as the first step instead of a p+ diffusion. Further, solid or gaseous dopant sources can be used as diffusion sources. The boron dopant can be diffused on one side of the wafer only by back-to-back loading of wafers into the diffusion boats.

Figure 3:
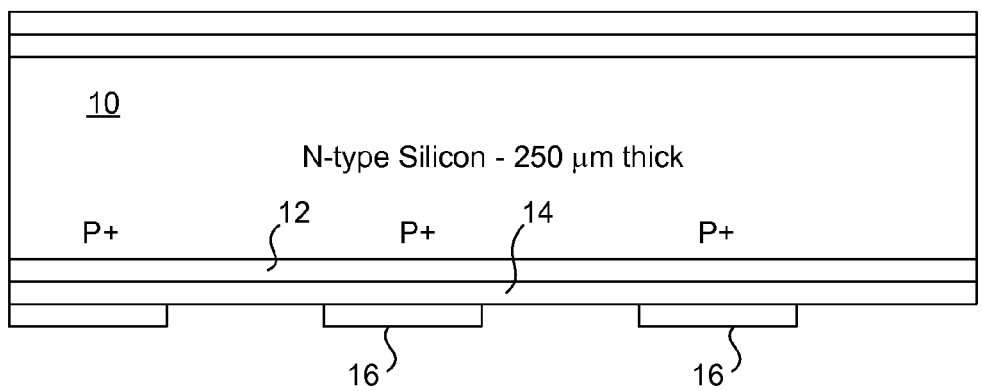

Next as shown in FIG. 3, a patterned etch resist 16 is applied over the back side thermal oxide 14. The etch resist is directly patterned on the structure by screen-printing, pad printing, inkjet printing, or roll transfer printing. Resists are then either thermal or UV-cured.

Figure 4:
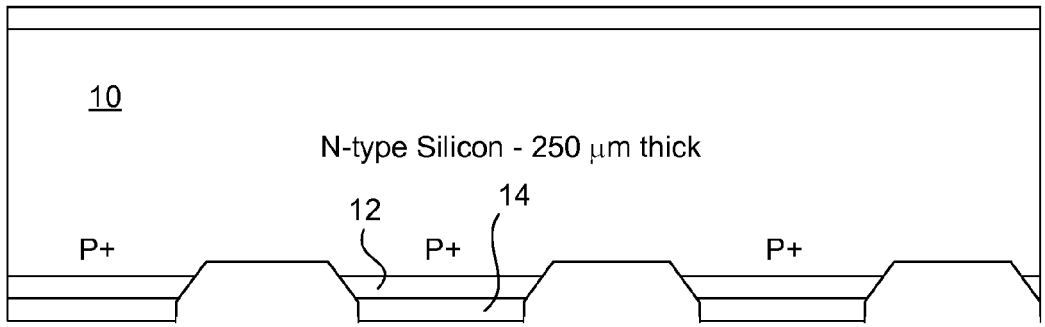

As shown in FIG. 4, openings in the thermal oxide are chemically etched in the areas not covered by the printed etch resist 16. The resist is removed in a caustic solution with the width of the openings being about 0.7 mm and the pitch of the openings being about 2 mm. Another caustic etch (concentrated KOH) is then used to etch about 3 μm of silicon completely through layer 12 and the diffusion junction of FIG. 2, as taught in U.S. Pat. No. 5,053,083, for example. The boron diffusion on the front side of the wafer is also removed during this etch.

Figure 5:
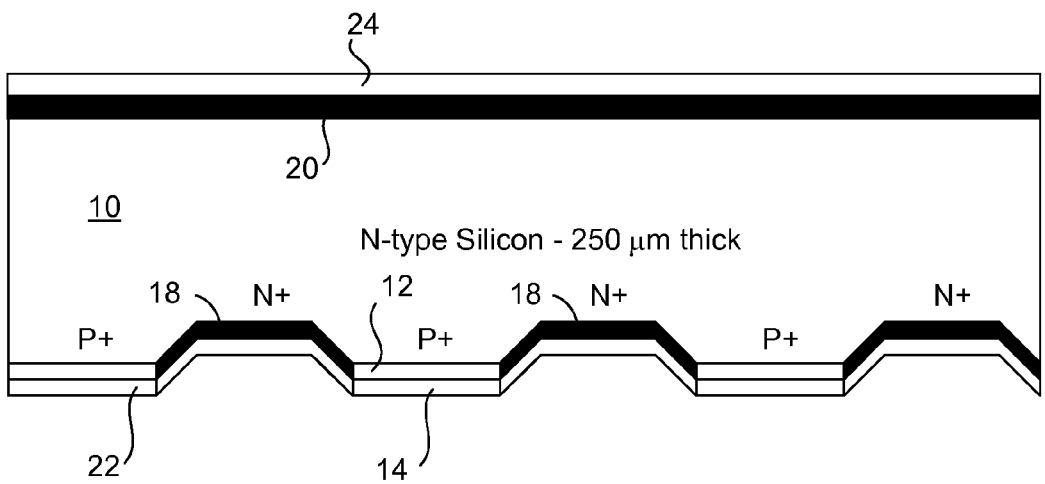

The wafers are then diffused on both sides in a high temperature diffusion furnace to form n+ layer 18 on the back side and n+ layer 20 on the top surface as shown in FIG. 5. In a preferred embodiment, a liquid phosphorous source ($POCl_3$) is used. Alternatively, the polarity of the diffusions can be reversed, consistent with FIG. 2, with p+ diffusion instead of n+ diffusion. Alternatively, solid or gaseous dopant sources can be used as diffusion sources, and the wafers can be diffused on one side only by back-to-back loading of the wafers in the diffusion boats. The high temperature diffusion furnace also forms thermally grown oxide layer 22 over n+ region 18 and oxide layer 24 over layer 20. In the preferred embodiment, the junction depth of regions 18, 20 is 0.9±0.2 μm, and the resultant sheet resistance is 40±13 ohms/square. The thickness of the thermal oxide layers 22, 24 is 950±150 Å.

Other n+ dopants such as As or Sb can be employed. Alternatively, a boron or phosphorous silicate glass layer, of opposite polarity from the dopant applied in step 2, can be applied to the back side of the side using atmospheric pressure chemical vapor deposition (APCVD) to act as a dopant source. The dopant is diffused into the silicon in a high temperature diffusion furnace. If an APCVD dopant source is used as in FIG. 2, then both dopant types can be diffused simultaneously.

Figure 6:
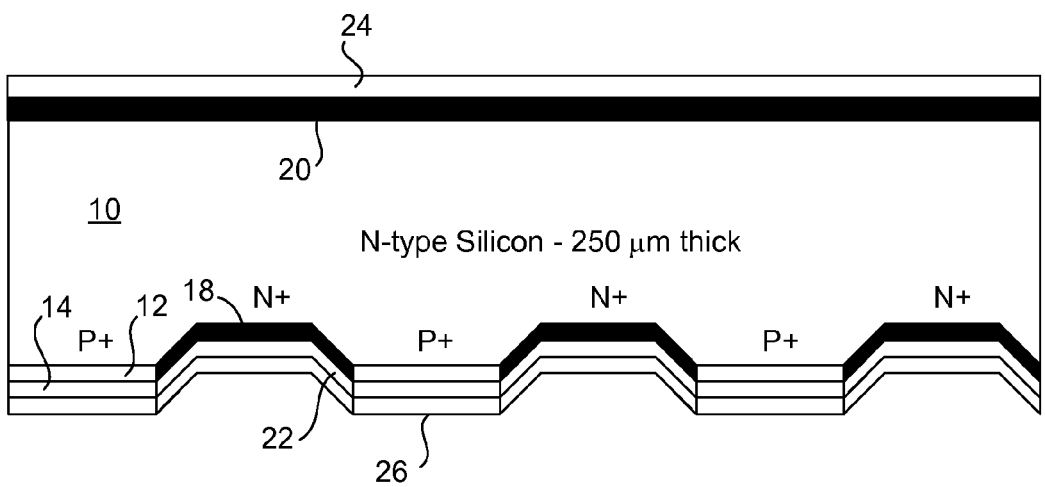

Next as shown in FIG. 6, an unpatterned etch resist 26 is applied over the back side of substrate 10 and is used to protect the back side oxide 14, 22 from subsequent etching. The etch resist is directly applied on the substrate by screen printing, pad printing, inkjet printing, or a roll transfer printing. The resist can then be cured either thermally or by UV.

Figure 7:
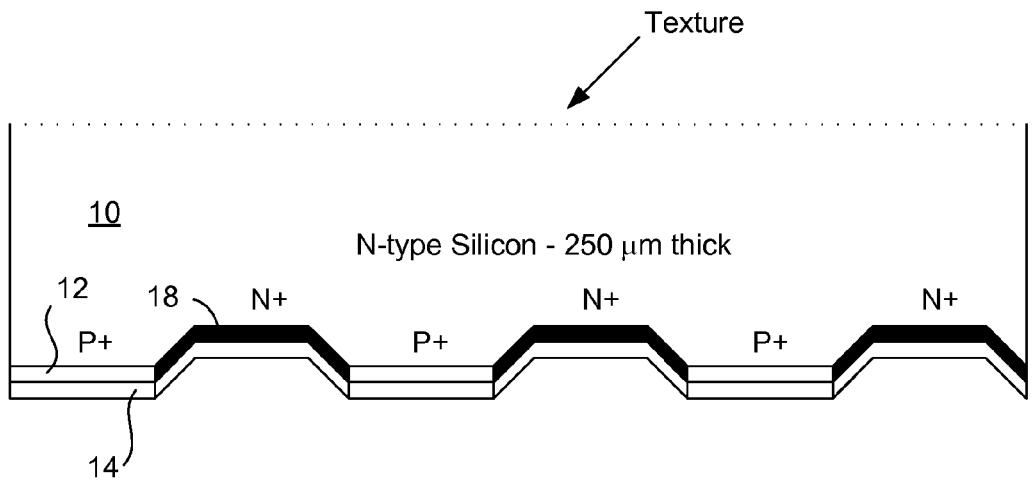

As shown in FIG. 7, a textured surface is next formed in the top surface of substrate 10. In the preferred embodiment (100) oriented single crystal wafers are used and the oxide on the top surface is removed by chemical etching. The back side is protected during this etch by the etch resist 26 applied in FIG. 6. After the front oxide is removed, the back side etch resist is removed in a caustic solution. Another caustic solution (KOH/IPA) is then used to preferentially expose the (111) planes of silicon on the front side of substrate 10, creating a textured surface with square pyramidal features that have a random distribution of apexes and heights, with heights typically ranging from 1-10 μm. This random texture greatly assists in the coupling of light energy into the solar cell and hence improves efficiency.

For wafers that are not (100) oriented single crystal, texture can also be created by a number of alternative methods, including acid etching, plasma etching, and mechanical abrasion. Following the texturing, the wafers are cleaned using a standard pre-diffusion wet cleansing sequence.

Figure 8:
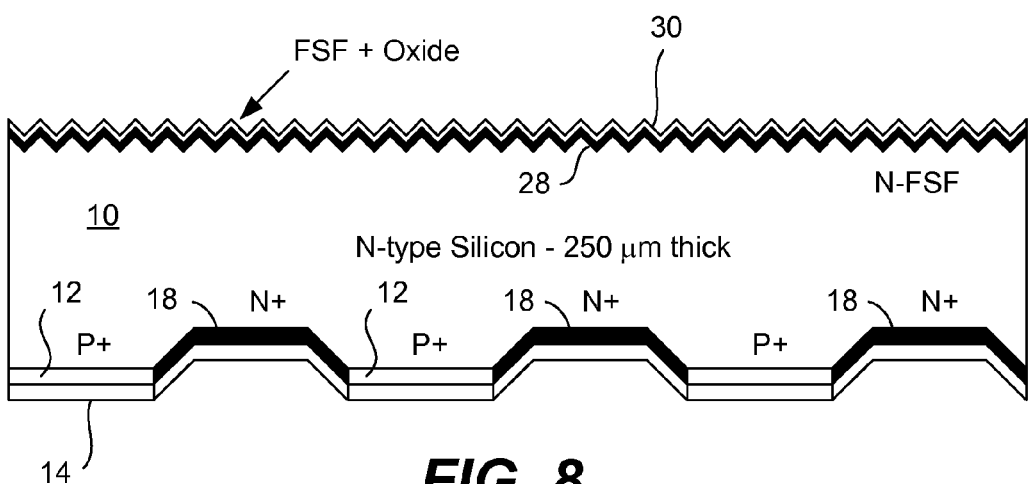

Next, as shown in FIG. 8, the wafers are diffused and oxidized on both sides in a high temperature diffusion furnace, creating doped layer 28 and thermally grown oxide layer 30 on the textured surface. In the preferred embodiment, a liquid phosphorous dopant source ($POCl_3$) is used. The diffusion serves to create a front surface electrical field and good passivation of the silicon-silicon dioxide interface. The combined effect is very low surface recombination velocity, which is essential for high efficiency in the solar cell design.

Alternatively, solid or gaseous dopant sources can be used as diffusion sources. Further, the wafers can be diffused on the front side on a by back-to-back loading of wafers in the diffusion boats.

Other n+ dopants such as As or Sb can be used. Alternatively, a p-type dopant, such as boron, can be used to create a floating junction, which provides good passivation of the silicon-silicon dioxide interface. Further, a boron or phosphorous silicate glass layer can be used as a dopant source. In the preferred embodiment, the junction depth is 0.38±0.1 μm and the resultant sheet resistivity is 115±15 ohms/square. The thickness of the thermal oxide layer 30 is 350±100 Å.

Alternatively, this step can be eliminated, altogether or by using another technique, such as a fixed change in a SiN ARC, to create good surface passivation, or by moving the texture etch before the doping mask and using a single n+ diffusion and oxidation to diffuse both sides of the wafer.

Figure 9:
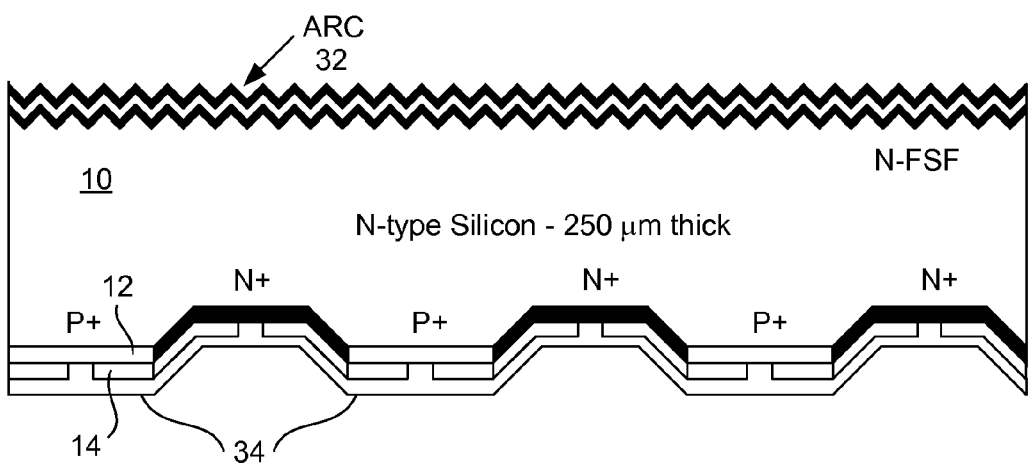

As shown in FIG. 9, an antireflection coating (ARC) 32, such as SiN or $TiO_2$ is then applied to the front surface of the solar cell. This coating assists in the coupling of light energy into the solar cell and hence improves efficiency. Alternatively, the ARC can be deposited after deposition of the seed metal stack described in FIG. 12, infra. Further, the ARC can be applied to both sides of substrate 10.

Figure 10:
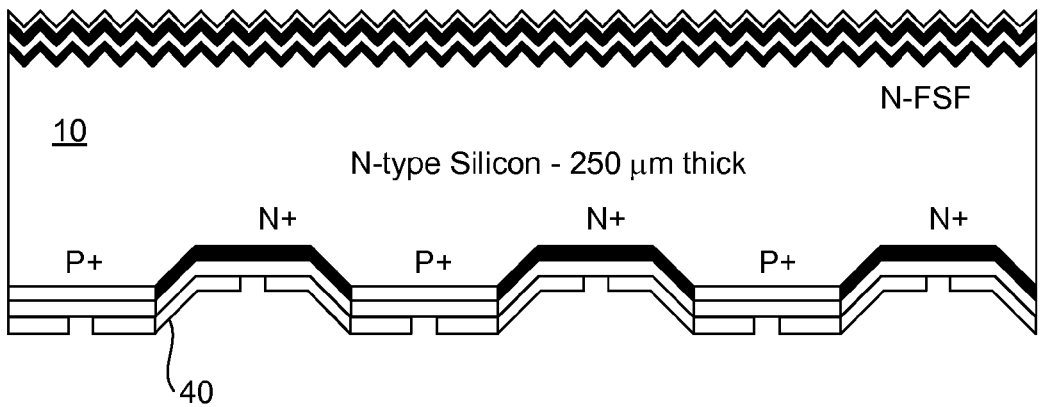
Figure 11:
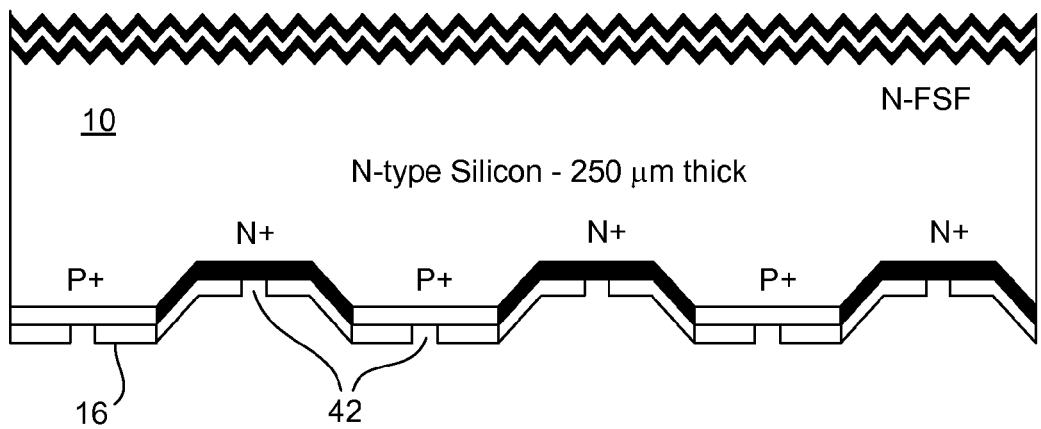

In FIG. 10, the patterned etch resist 40 is applied over the back side thermal oxide by screen printing, pad printing, inkjet printing, or a roll transfer printing. Resist 40 is then either thermal or UV cured. Depending on the ARC material, a patterned etch resist may be applied over the front of the solar cell to protect the ARC from subsequent etching. In FIG. 11, arrays of small contact openings 42 are chemically etched in the thermal oxide over both the p and n regions 12, 18, then the etch resist is stripped using a caustic solution. The total contact area as a fraction of the entire back side is typically less than 5%. Reducing the metal to semiconductor contact area greatly reduces photo-generated carrier recombination at the back surface of the solar cell, and hence increases cell efficiency.

Alternatively, the contact mask and contact oxide etch can be eliminated from the process and contact openings can be formed in the oxide layer by other methods, such as laser ablation of oxide, or direct printing of chemical pastes that etch the oxide. Laser ablation and printed chemical paste can be used in the steps of FIG. 4, also.

Figure 12:
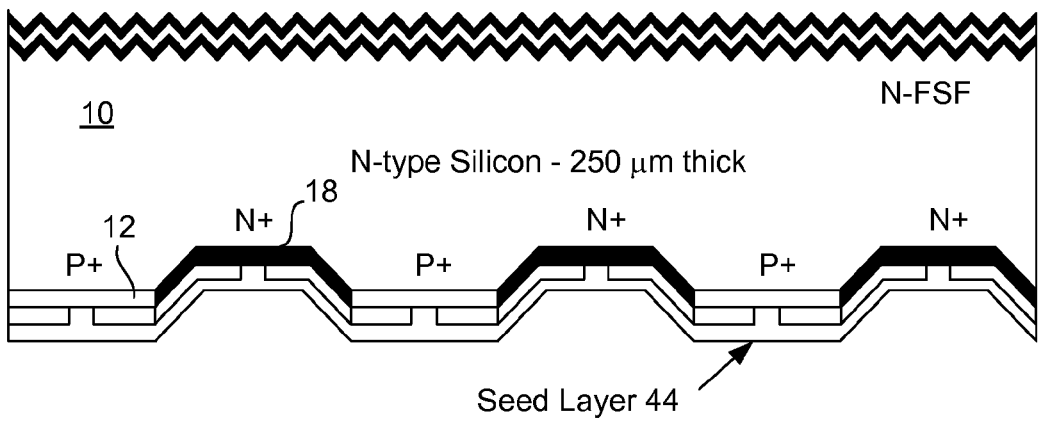

In FIG. 12, a thin (approximately 400 nm) 3-layer seed metal stack 44 is sputtered or evaporated onto the solar cell for contacts to p+ region 12 and n+ region 18. The first layer of the stack, aluminum in the preferred embodiment, makes ohmic contact to the semiconductor material and acts as a back surface reflector. In thin silicon solar cells, weakly absorbed infrared radiation passes through the thickness of silicon and is often lost by absorption in backside metallization. In the preferred embodiment, the seed layer covers mostly silicon oxide, except in small contact openings where it contacts the silicon. The metallized silicon oxide stack is designed to be an excellent infrared reflector, reflecting light back into the cell and effectively multiplying the absorption path length. The front surface texture in combination with the back surface reflector can increase the optical path length to more than 20 times the wafer thickness. This design feature leads to higher photo-generated current in the solar cell.

A second layer, titanium-10%/tungsten-90% (TiW) in the preferred embodiment acts as a diffusion barrier to metals and other impurities. A third layer, copper (Cu) in the preferred embodiment, is used to provide a base for initiating electroplating of metal. Because the seed layer is not required to have significant current-carrying capacity, it can be made very thin. Hence, the manufacturing cost of depositing the seed layer is low. In the preferred embodiment, the metal layer comprises a Al(Si)/TiW/Cu stack, where the aluminum provides ohmic contact and back surface reflectance, TiW acts as the barrier layer, and Cu acts as the plating base. Alternatively, chromium (Cr) can be used as the barrier layer instead of TiW. The metal semiconductor contact can be annealed in a forming gas atmosphere, preferably at 400° C. Alternatively, the contact anneal step can be eliminated.

Figure 13:
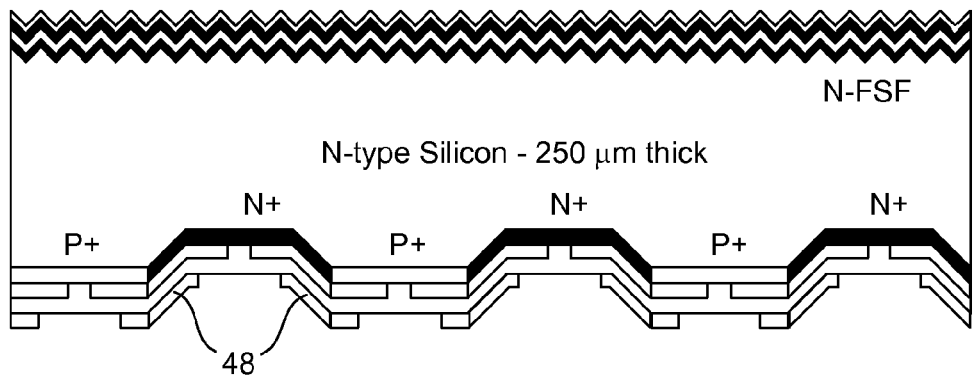

Next, as shown in FIG. 13, a patterned plating resist 48 is applied to the seed layer. The plating resist is directly patterned on the solar cell by screen printing, pad printing, inkjet printing, or a roll transfer screening. In the preferred embodiment, the plating resist is directly patterned on the wafer by screen printing. After application, the plating resist is cured to harden it against the subsequent electroplating solution. Metal does not plate in areas covered by the plating resist.

Figure 14:
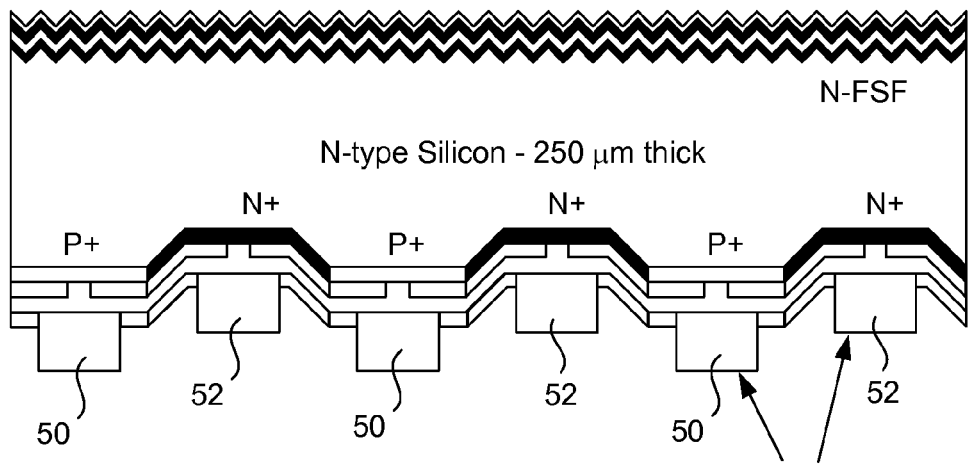

In FIG. 14, the thickness of the metal layer in regions without plating resist is greatly increased by electroplating or electroless plating a good electrical conductor to act as low series resistance metal grid lines 50, 52. In the preferred embodiment, about 20 µm of copper are electroplated. A thin capping layer, such as tin or silver, may be plated after the copper to improve solderability and/or to prevent etching of plated areas during etch back. Preferably about 7 µm of tin are electroplated.

Figure 15:
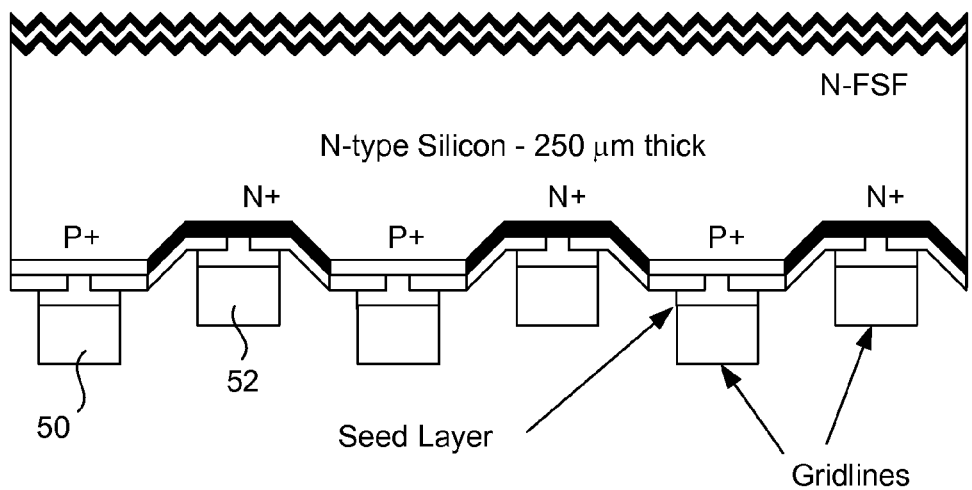

Finally, as shown in FIG. 15, plating resist 48 is stripped and the thin seed metal 44 between the metal grid lines is removed by chemical etching. The etch back chemistries are chosen such that they selectively etch the seed metal stack components over the plated metal capping layer. Alternatively, a small amount of metal on the plated conductive lines may be sacrificed during etch back if an etch resistant metal capping layer is not used, or if the seed layer etch chemistries are not selective.

Alternatively, in FIG. 13 a resist pattern can be used to cover the contact areas and then remove all exposed seed layer by etching thereafter the resist is removed, and the thickness of the metal layer in the contact areas is increased by plating as in FIG. 14.

Figure 16:
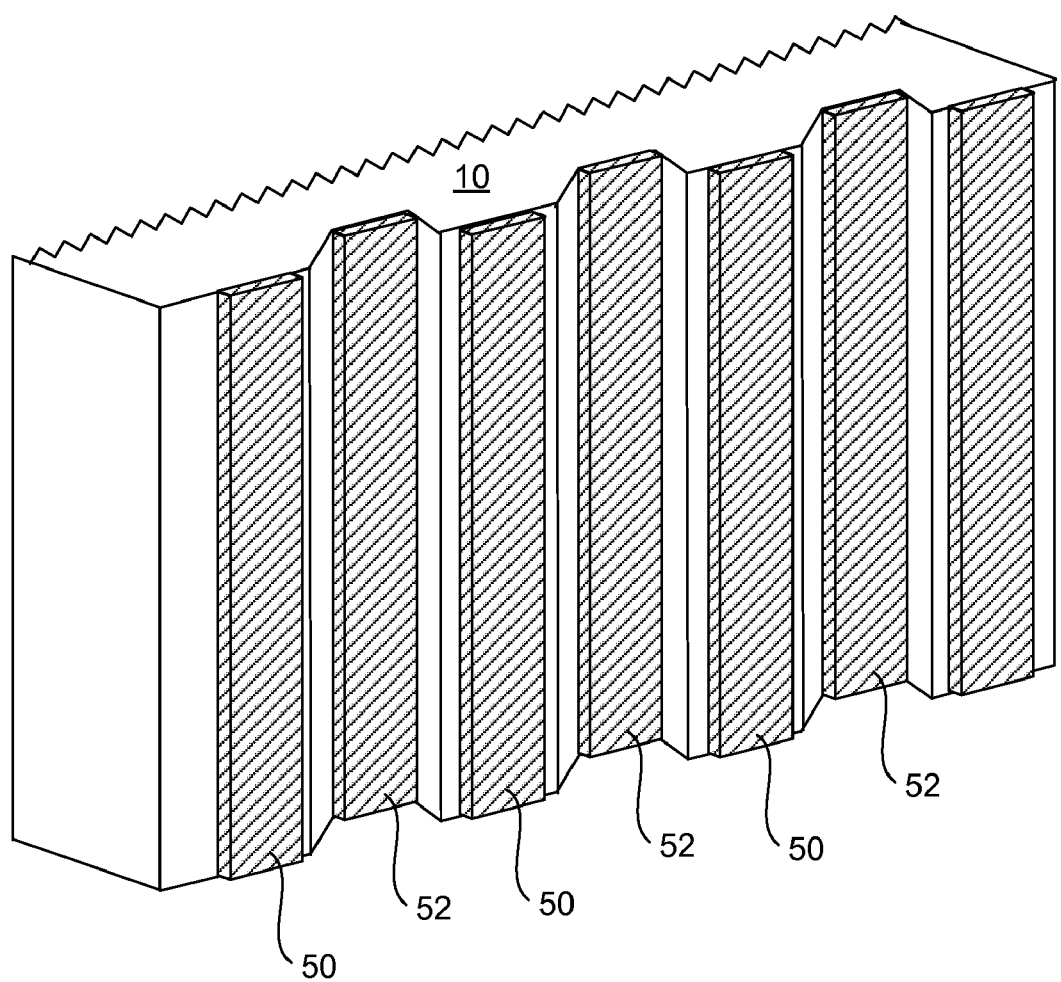
FIG. 16 is a perspective view illustrating the back side of a finished solar cell fabricated in accordance with the invention.

The final structure is shown in perspective view in FIG. 16 showing the interdigitated metal contacts 50, 52 to the p+ regions and n+ regions, respectively, of the solar cell.

A solar cell fabricated in accordance with the invention is economical to manufacture through use of printing technology. The stacked metal contacts provide good ohmic connection and reflection properties on the back side of the cell, and the textured surface on the front side provides greater capture of photons and increased operating efficiency for the cell. A number of alternative processing steps and structural elements have been suggested for the preferred embodiment. Thus while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a solar cell comprising the steps of:
   a) providing a silicon substrate having a front surface and a back surface,
   b) forming a first doped region of first conductivity type in the back surface and a thermally grown silicon oxide layer over the doped region,
   c) printing a patterned etch resist over the back surface whereby a plurality of rows across the back surface are not masked,
   d) removing exposed silicon oxide from the back surface,
   e) removing the patterned etch resist from the back surface,
   f) removing exposed silicon from the back surface extending through the first doped region,
   g) diffusing a dopant of second conductivity type into the back surface where silicon oxide was removed in step d) thereby forming a plurality of regions of second conductivity type between regions of first conductivity type and a thermally grown oxide over the back surface, and
   h) forming first and second interdigitated metal contacts respectively ohmically contacting the regions of first conductivity type and the regions of second conductivity type, including:
      h1) printing a patterned etch resist over the thermally grown oxide from step g) with arrays of small contact openings over the regions of first conductivity type and the regions of second conductivity type,
      h2) removing the thermally grown oxide from the arrays of small contact openings,
      h3) removing the patterned etch resist, and
      h4) forming the first and second interdigitated metal contacts respectively ohmically contacting the regions of first conductivity type and the regions of second conductivity type.

2. The method as defined by claim 1, wherein step h4) comprises:
   i) forming a first metal layer on the back surface contacting the regions of first conductivity type and the regions of second conductivity type through the thermally grown oxide and serving as an infrared reflector,
   ii) forming a barrier metal layer over the first metal layer,
   iii) forming a base metal layer over the barrier layer that functions as a base to initiate metal plating,
   iv) printing a plating resist over the base metal layer to thereby define the geometries of the first and second metal contacts,
   v) plating an electrically conductive metal layer over the base metal layer,
   vi) stripping the plating resist, and
   vii) etching the exposed base metal layer.

3. The method as defined by claim 1 wherein steps vii) and vi) precede step v).

4. The method as defined by claim 2, wherein a solderable layer is plated over the electrically conductive metal layer after step v).

5. The method as defined by claim 4 where the solderable layer is resistant to the etchant used in step vii).

6. The method as defined by claim 2, and further including the steps of:
   i) forming a textured surface on the front surface, and
   j) forming an antireflection coating over the textured surface.

7. The method as defined by claim 6, wherein step i) includes etching the front surface.

8. The method as defined by claim 6, wherein step i) includes mechanical abrasion.

9. The method as defined by claim 6, wherein step j) includes forming a nitride coating over the textured surface.

10. The method as defined by claim 6, wherein step j) includes forming a titanium oxide coating over the textured surface.

11. The method as defined by claim 6, and further including after step i) the step of forming a front surface diffusion in the textured surface and a silicon oxide layer over the textured surface.

12. The method as defined by claim 1, and further including the steps of:
   i) forming a textured surface on the front surface, and
   j) forming an antireflection coating over the textured surface.

13. The method as defined by claim 12, wherein step i) includes etching the front surface.

14. The method as defined by claim 12, wherein step i) includes mechanical abrasion.

15. The method as defined by claim 12, wherein step j) includes forming a nitride coating over the textured surface.

16. The method as defined by claim 12, wherein step j) includes forming a titanium oxide coating over the textured surface.

17. The method as defined by claim 12, and further including after step i) the step of forming a front surface diffusion in the textured surface and a silicon oxide layer over the textured surface.

18. The method as defined by claim 2, wherein the contact metal layer comprises aluminum, the barrier metal layer comprises a titanium tungsten, and the plating base and electrically conductive layers comprise copper.

* * * * *